US010636628B2

(12) United States Patent
Ghosh et al.

(10) Patent No.: US 10,636,628 B2
(45) Date of Patent: Apr. 28, 2020

(54) METHOD FOR CLEANING A PROCESS CHAMBER

(71) Applicant: Applied Materials, Inc., Santa Clara, CA (US)

(72) Inventors: Kalyanjit Ghosh, San Jose, CA (US); Shailendra Srivastava, Fremont, CA (US); Tejas Ulavi, San Jose, CA (US); Yusheng Zhou, Sunnyvale, CA (US); Amit Kumar Bansal, Milpitas, CA (US); Sanjeev Baluja, Campbell, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 228 days.

(21) Appl. No.: 15/701,222

(22) Filed: Sep. 11, 2017

(65) Prior Publication Data

US 2019/0080889 A1   Mar. 14, 2019

(51) Int. Cl.
| | |
|---|---|
| *H01J 37/32* | (2006.01) |
| *H01L 21/67* | (2006.01) |
| *G03F 7/42* | (2006.01) |
| *B08B 7/00* | (2006.01) |
| *H01L 21/683* | (2006.01) |
| *H01L 21/687* | (2006.01) |

(52) U.S. Cl.
CPC .. *H01J 37/32495* (2013.01); *H01J 37/32862* (2013.01); *H01L 21/67017* (2013.01); *B08B 7/0021* (2013.01); *G03F 7/427* (2013.01); *H01J 37/32834* (2013.01); *H01L 21/67028* (2013.01); *H01L 21/6831* (2013.01); *H01L 21/68742* (2013.01)

(58) Field of Classification Search
CPC .. B08B 7/0021; G03F 7/427; H01J 37/32495; H01J 37/32834; H01J 37/32862; H01L 21/67017; H01L 21/67028; H01L 21/6831; H01L 21/68742
See application file for complete search history.

(56) References Cited

U.S. PATENT DOCUMENTS

| | | | |
|---|---|---|---|
| 5,558,717 A * | 9/1996 | Zhao | ................... C23C 16/4401 |
| | | | 118/715 |
| 5,810,936 A | 9/1998 | Leung et al. | |
| 5,846,332 A | 12/1998 | Zhao et al. | |
| 5,885,356 A | 3/1999 | Zhao et al. | |
| 5,895,530 A | 4/1999 | Shrotriya et al. | |

(Continued)

*Primary Examiner* — Katelyn B Whatley
(74) *Attorney, Agent, or Firm* — Patterson + Sheridan LLP (57) ABSTRACT

Implementations disclosed herein generally relate to systems and methods of protecting a substrate support in a process chamber from cleaning fluid during a cleaning process. The method of cleaning the process chamber includes positioning in the process chamber a cover substrate above a substrate support and a process kit that separates a purge volume from a process volume. The method of cleaning includes flowing a purge gas in the purge volume to protect the substrate support and flowing a cleaning fluid to a process volume above the cover substrate, flowing the cleaning fluid in the process volume to an outer flow path, and to an exhaust outlet in the chamber body. The purge volume is maintained at a positive pressure with respect to the process volume to block the cleaning fluid from the purge volume.

13 Claims, 7 Drawing Sheets

(56) References Cited

U.S. PATENT DOCUMENTS

| | | | |
|---|---|---|---|
| 5,945,351 A * | 8/1999 | Mathuni | H01J 37/32357 |
| | | | 438/706 |
| 6,026,762 A | 2/2000 | Kao et al. | |
| 6,159,299 A | 12/2000 | Koai et al. | |
| 6,274,058 B1 | 8/2001 | Rajagopalan et al. | |
| 6,406,589 B1 * | 6/2002 | Yanagisawa | H01J 37/32357 |
| | | | 156/345.3 |
| 6,582,522 B2 | 6/2003 | Luo et al. | |
| 6,645,884 B1 | 11/2003 | Yang et al. | |
| 7,816,272 B2 | 10/2010 | Tsutae | |
| 8,252,410 B2 | 8/2012 | Rasheed | |
| 8,366,953 B2 | 2/2013 | Kohno et al. | |
| 9,528,183 B2 | 12/2016 | Wu et al. | |
| 2012/0237693 A1 | 9/2012 | Jackson et al. | |
| 2015/0255259 A1 * | 9/2015 | Li | H01J 37/32091 |
| | | | 134/18 |
| 2017/0178758 A1 | 6/2017 | Ha et al. | |

* cited by examiner

METHOD FOR CLEANING A PROCESS CHAMBER

BACKGROUND

Field of the Disclosure

Implementations described herein generally relate to a method and system for cleaning a process chamber. More specifically, implementations disclosed herein relate to a method and system for manufacturing substrates in a process chamber and for cleaning the process chamber while protecting components of the process chamber from damage during the cleaning process.

Description of the Related Art

In the fabrication of integrated circuits, deposition processes such as chemical vapor deposition (CVD) or plasma enhanced CVD processes are used to deposit films of various materials upon semiconductor substrates. These depositions may take place in an enclosed process chamber. Process fluids are used to deposit films on the substrate, but also deposit residue on the internal walls and other components of the process chamber. This residue builds up as more substrates are processed in the chamber and leads to generation of particles and other contaminants. These particles and contaminants can lead to the degradation of the deposited films on the substrates causing product quality issues.

Process chambers must be periodically cleaned using a cleaning process to remove the deposited residues on the chamber components. Cleaning fluids are used during the cleaning process to clean the process chamber after substrates have been manufactured. The temperatures used in the process chamber during the processing of the substrates have been increasing to achieve better film quality for the substrates. Higher temperatures during the processing of substrates results in higher temperatures for chamber components that may be exposed to the cleaning fluid during the cleaning process.

Cleaning fluids used such as fluorine-containing reactive gases may react with chamber components to generate contaminants during the cleaning process. For example, the substrate support in the process chamber may be made of materials, including aluminum nitride, that react with the cleaning fluid to generate contaminants, including aluminum fluoride (AlF3), during the cleaning process. As the cleaning process takes place with chamber components at higher temperatures, contaminants formed due to chemical reactions with materials of the substrate support increases substantially. Cleaning contaminants also may sublimate on cooler chamber components, including a fluid distribution plate in the process chamber.

Thus, there is a need for an improved system and method for cleaning the process chamber.

SUMMARY

Implementations disclosed herein generally relate to systems and methods to prevent free radical damage to sensitive components in a process chamber and to enhance flow profiles. The process chamber utilizes a cover substrate and an inert bottom purge flow to shield the substrate support from halogen reactants such that the substrate support may be heated to temperatures greater than about 650 degrees Celsius. During a cleaning process, the cover substrate and the purge flow restricts cleaning fluid from contacting the substrate support.

In one implementation, a method of cleaning a process chamber includes positioning a cover substrate above a substrate support in an interior volume in a chamber body of the process chamber. A process kit including a top edge member and a pumping liner are disposed in the interior volume. The pumping liner separates a purge volume disposed below the cover substrate and the top edge member from an outer flow path disposed between the chamber body and the pumping liner. The method of cleaning the process chamber includes performing a cleaning process. The cleaning process includes flowing a purge gas in the purge volume. A bottom support surface and a side support surface of the substrate support are disposed in the purge volume. The cleaning process includes flowing a cleaning fluid through a fluid distribution plate to a process volume disposed between the fluid distribution plate and the cover substrate. The cleaning process includes flowing the cleaning fluid in the process volume to the outer flow path, flowing the cleaning fluid in the outer flow path to an exhaust outlet in the chamber body, and maintaining the purge volume at a positive pressure with respect to the process volume so as to block the cleaning fluid in the process volume from flowing into the purge volume.

In another implementation, a method of cleaning a process chamber includes forming a top purge barrier in an interior volume of a chamber body of the process chamber with the top purge barrier separating a process volume disposed above the top purge barrier and a purge volume disposed below the top purge barrier. The top purge barrier includes a cover substrate and a top edge member disposed above a substrate support in a spaced position. A process kit includes the top edge member and a pumping liner disposed in the interior volume. The pumping liner separates the purge volume from an outer flow path disposed between the chamber body and the pumping liner. The method of cleaning the process chamber includes performing a cleaning process. The cleaning process includes flowing a purge gas to the purge volume and from the purge volume to the process volume through a purge gap extending through the top purge barrier, and flowing a cleaning fluid from a cleaning fluid supply to the process volume disposed in the interior volume. The cleaning process further includes flowing the cleaning fluid and the purge gas from the process volume to the outer flow path through a top opening in fluid communication with the process volume, and flowing the cleaning fluid and the purge gas in the outer flow path to an exhaust outlet in fluid communication with the outer flow path and in the chamber body. The flowing of the purge gas through the purge gap blocks the cleaning fluid in the process volume from flowing to the purge volume.

In another implementation, a process chamber includes a chamber body of the process chamber having an interior volume, and the chamber body has a chamber interior surface. A substrate support disposed in the interior volume, and a process kit is disposed in the interior volume. The process kit includes a top edge member disposed outwardly from the substrate support, and a pumping liner disposed outwardly from the substrate support in the chamber body. The pumping liner surrounds a purge volume, and an outer flow path is disposed between the pumping liner and the interior chamber surface. A purge gas opening in the chamber body is in fluid communication with the purge volume. An exhaust outlet is in the chamber body, and is in fluid communication with the outer flow path. A cover substrate is disposed above the substrate support, and a purge gap is disposed between the top edge member and the cover substrate.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations disclosed herein generally relate to systems and methods to protect a substrate support from cleaning fluid used during a cleaning process of the process chamber. The process chamber utilizes a cover substrate, process kit, and the flow of purge gas to protect the substrate support from chemical reactants in the cleaning fluid. A top purge barrier in the process chamber separates a process volume disposed above the top purge barrier and a purge volume disposed below the top purge barrier. During the cleaning process, the substrate support is disposed in the purge volume and is protected from the cleaning fluid by a purge gas curtain formed by the purge gas.

Figure 1:
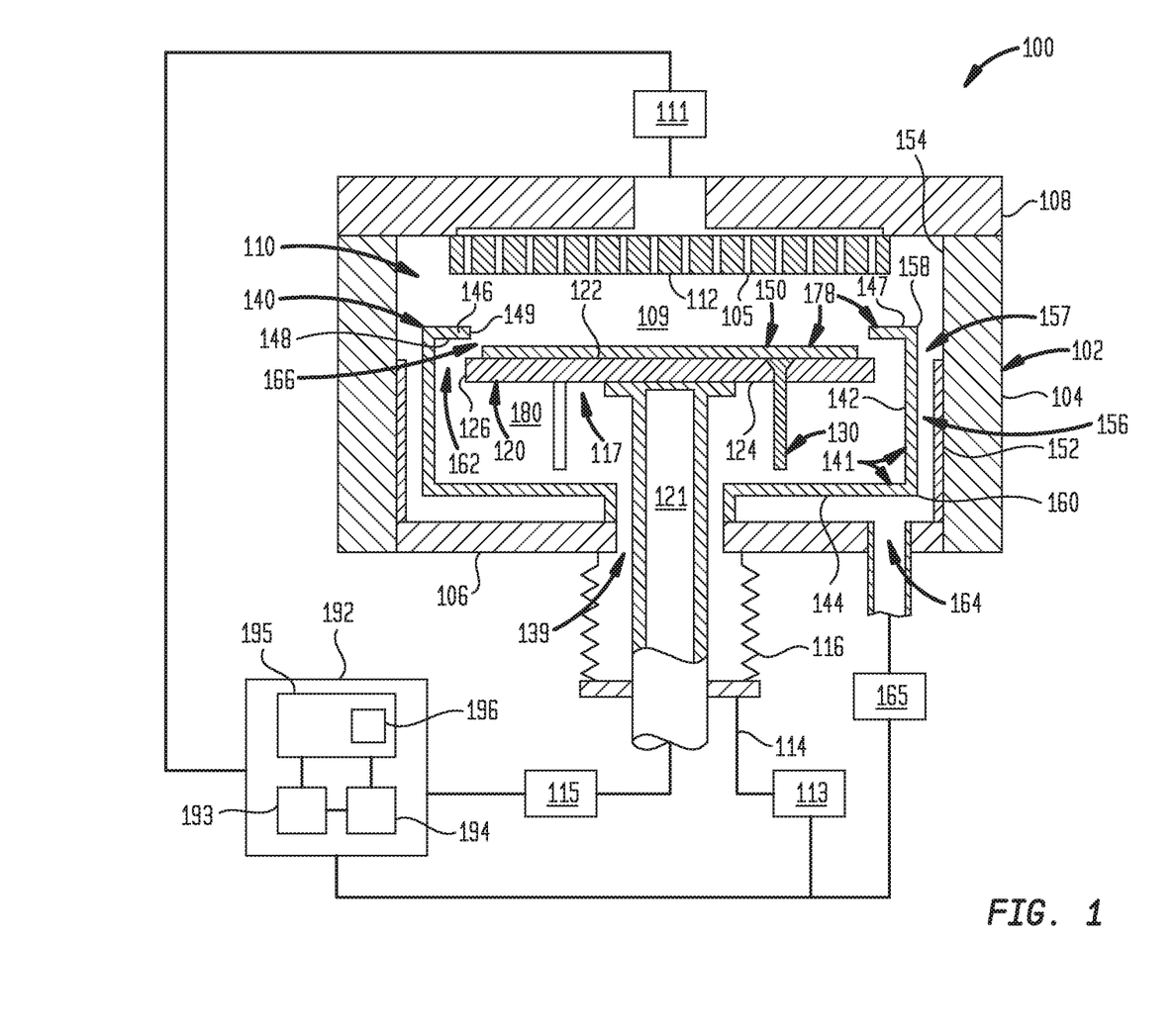
FIG. 1 is a side sectional view of a process chamber with a cover substrate in a non-spaced position, according to one implementation of the disclosure.

FIG. 1 is a side sectional view of a process chamber 100 with a cover substrate 150 in a non-spaced position, according to one implementation of the disclosure. The process chamber 100 includes a chamber body 102 having a chamber side wall 104, a chamber bottom 106, and a lid 108 disposed on the chamber side wall 104. The chamber side wall 104, chamber bottom 106, and lid 108 define an interior volume 110 of the process chamber 100. The chamber side wall 104 may have an annular shape or include multiple walls to form a rectangular or square shape. The process chamber 100 includes a fluid distribution plate 112 with openings 105 and a substrate support 120. The region between the cover substrate 150 in the raised position 117 (FIG. 1) and the fluid distribution plate 112 is defined by the process volume 109. The fluid distribution plate 112 supplies cleaning fluid from a cleaning fluid supply 111 to the process volume 109 through the fluid distribution plate 112. The cleaning fluid supply 111 may be a remote plasma source in some implementations. In other implementations, the process chamber 100 may include a plasma source (e.g., a capacitively coupled plasma chamber with a RF-hot fluid distribution plate).

The substrate support 120 is disposed in the interior volume 110. The substrate support 120 may be formed of a ceramic material, such as aluminum nitride. The substrate support 120 may include an electrostatic chuck, a ceramic body, a heater, a vacuum chuck, a susceptor, or a combination thereof. The substrate support 120 has a top support surface 122 that receives and supports a substrate (not shown) during a manufacturing process of the substrate. The substrate would replace the cover substrate 150, shown in FIG. 1 on the top support surface 122. The substrate support 120 further includes a bottom support surface 124, and a side support surface 126 disposed between the bottom support surface 124 and the top support surface 122.

In FIG. 1, the cover substrate 150 is shown in the non-spaced position. When in the non-spaced position, the cover substrate 150 is in physical contact with the top support surface 122 of the substrate support 120. In some implementations, the substrate support 120 has been raised to the raised position 117 with the cover substrate 150 in physical contact with the top support surface 122. A process volume 109 is disposed between the cover substrate 150 and the fluid distribution plate 112.

Figure 2:
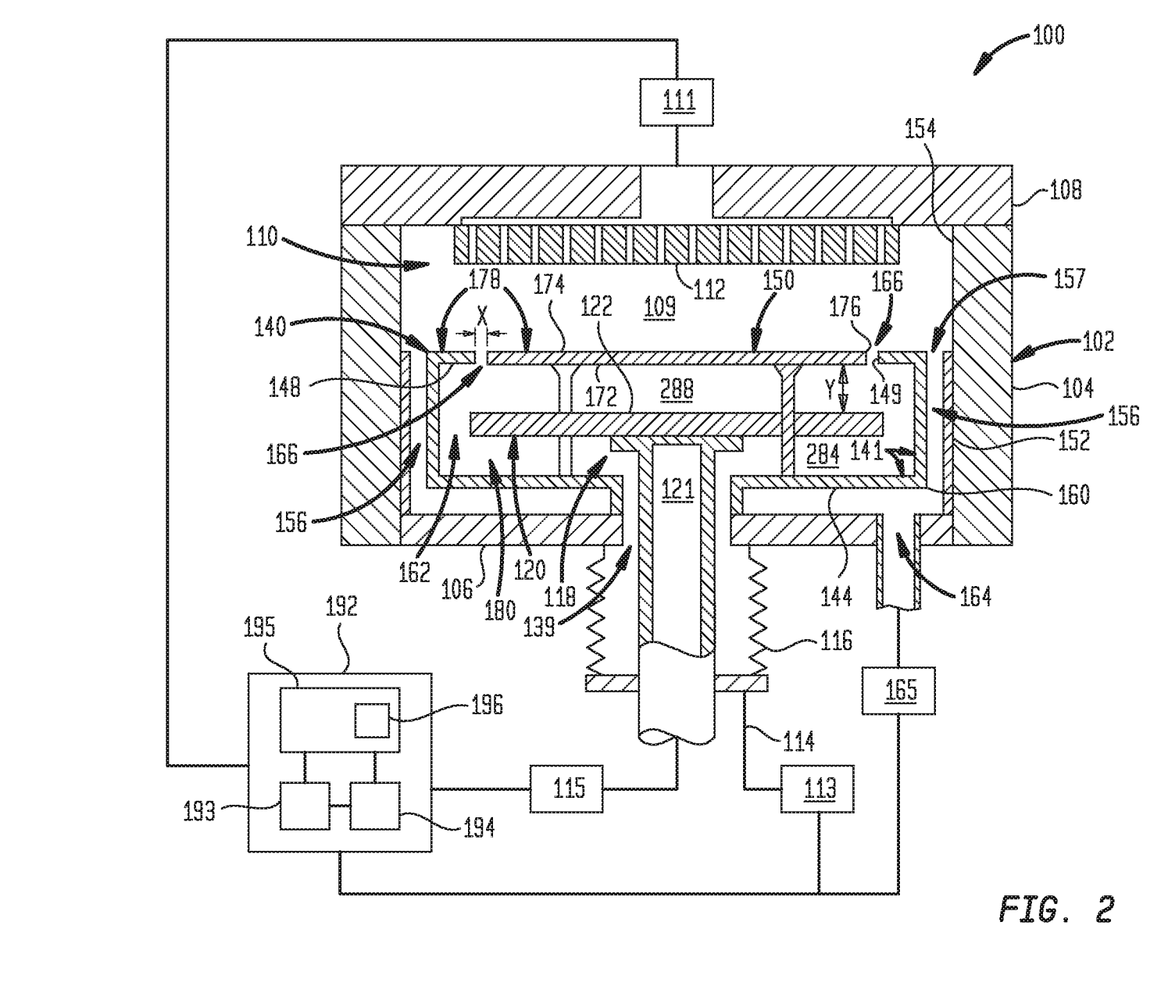
FIG. 2 is a side sectional view of the process chamber with the cover substrate in a spaced position, according to one implementation of the disclosure.
Figure 6:
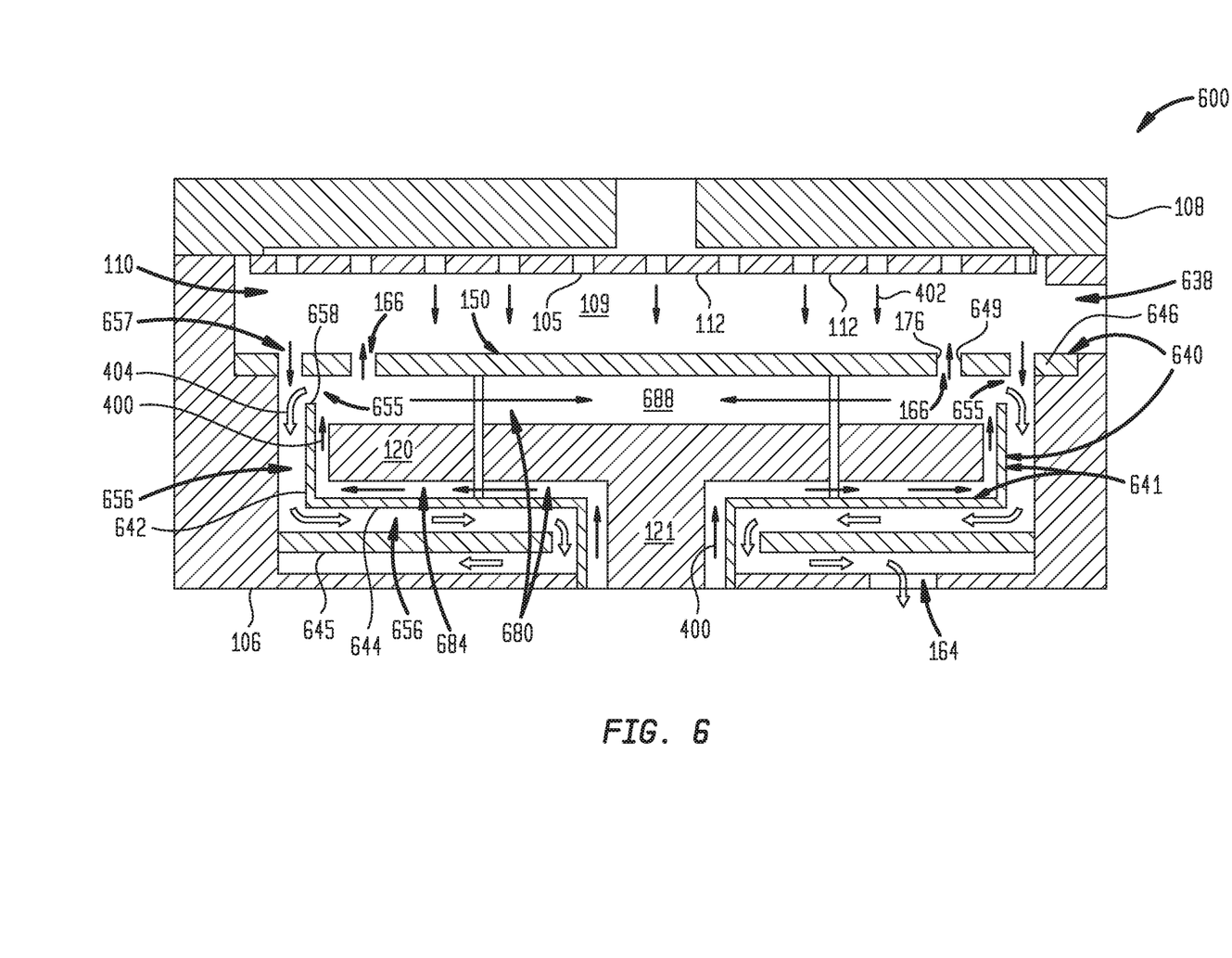
FIG. 6 is a cross-sectional schematic of a process chamber with the cover substrate in the spaced position showing flow of the cleaning fluid during the cleaning process, according to an alternative implementation of the disclosure.

The substrate support 120 is coupled to a supporting shaft 121 that is coupled to a lift mechanism 115 below the chamber bottom 106 of the process chamber 100. A bellows 116 may be disposed around the portion of the supporting shaft 121 that is below the chamber bottom 106 of the process chamber 100 to isolate the supporting shaft 121 from the external environment. The lift mechanism 115 is configured to move the substrate support 120 between the raised position 117, as shown in FIG. 1, and a lowered position 118, as shown in FIG. 2. The substrate support 120 may be placed in the raised position 117 during the manufacturing process for the substrate (not shown). In the lowered position 118, a robot or other transfer mechanism (not shown) may be used to place the cover substrate 150 in the process chamber 100. The lift pins 130 extend through the substrate support 120. A slit valve, as shown in FIG. 6, may extend through the chamber side wall 104 of chamber body 102 to provide an opening to transfer the cover substrate 150 into or out of the interior volume 110.

A purge gas may be supplied to the process chamber 100 during a cleaning process of the process chamber 100. The purge gas may be supplied from a purge gas supply 113 through a purge gas line 114. In some implementations, the purge gas line 114 may be coupled to the process chamber 100 through the bellows 116 in order to maintain a positive pressure in the bellows 116 during movement of the substrate support 120 by the lift mechanism 115. The purge gas is supplied through a purge gas opening 139 formed between the chamber bottom 106 and the supporting shaft 121. The purge gas is supplied to a purge volume 180 in the process chamber 100.

The process chamber 100 further includes a process kit 140 that protects the chamber body 102 from processing fluids and provides flow paths for the processing fluids. The process kit 140 includes a pumping liner 141 and a top edge member 146. The pumping liner 141 surrounds the purge volume 180. The pumping liner 141 includes a side pumping liner 142 and the bottom pumping plate 144. In some implementations, the process kit 140 may include an outer pumping liner 152. The outer pumping liner 152 is disposed adjacent an interior chamber surface 154 of the chamber side wall 104. The side pumping liner 142 is spaced radially inward from the chamber side wall 104 to define an outer flow path 156.

The side pumping liner 142 extends from a top end 158 to a bottom end 160. The side pumping liner 142 is laterally spaced from the side support surface 126 of the substrate support 120 to form a substrate support outer opening 162. The side pumping liner 142 of the pumping liner 141 is disposed outwardly from the substrate support 120. The top end 158 of the side pumping liner 142 is disposed above the top support surface 122. The bottom end 160 is spaced from the chamber bottom 106 and is coupled to the bottom pumping plate 144. A bottom section of the outer flow path 156 is defined by the bottom pumping plate 144 and the chamber bottom 106. The bottom pumping plate 144 extends from the bottom end 160 of the side pumping liner 142 to a position adjacent the purge gas opening 139. An exhaust outlet 164 extends through the chamber bottom 106, and is in fluid communication with the outer flow path 156. The exhaust outlet 164 may be coupled to a vacuum pump 165.

The top edge member 146 of the process kit 140 is coupled to the side pumping liner 142. The top edge member 146 includes a top surface 147, a bottom surface 148, and a side surface 149. The top edge member 146 is vertically spaced from the top support surface 122 of the substrate support 120. At least a portion of the top edge member 146, including the side surface 149, extends over the top support surface 122 of the substrate support 120. At least a portion of the top edge member 146 is disposed outwardly from the substrate support 120. A purge gap 166 is disposed between the top edge member 146 and the cover substrate 150. The top edge member 146 has a side surface 149 that extends over the top support surface 122. In some implementations, the side surface 149 is laterally spaced from the cover substrate 150 on the top support surface 122 so as to not extend over the cover substrate 150.

A top purge barrier 178 is formed in the interior volume 110 of the chamber body 102 above the substrate support 120 by the cover substrate 150 and the top edge member 146. The top purge barrier 178 separates the process volume 109 disposed above the top purge barrier 178 and a purge volume 180 disposed below the top purge barrier 178. The pumping liner 141 separates the purge volume 180 from the outer flow path 156 disposed between the chamber body 102 and the pumping liner 141. The purge gap 166 extends through the top purge barrier 178. The pumping liner 141 further includes a top opening 157 extending from the process volume into the outer flow path 156 to provide fluid communication between the process volume 109 and the outer flow path 156.

In FIG. 1, a control unit 192 may be coupled to the process chamber 100 to control processing conditions. The control unit 192 comprises a central processing unit or CPU 193, support circuitry 194, and memory 195 containing associated control software 196. The control unit 192 may be one of any form of a general purpose computer processor that can be used in an industrial setting for controlling various chambers and sub-processors. The CPU 193 may use any suitable memory 195, such as random access memory, read only memory, floppy disk drive, compact disc drive, hard disk, or any other form of digital storage, local or remote. Various support circuits may be coupled to the CPU 193 for supporting the process chamber 100. The control unit 192 may be coupled to another controller that is located adjacent individual chamber components. Bi-directional communications between the control unit 192 and various other components of the process chamber 100 are handled through numerous signal cables collectively referred to as signal buses, some of which are shown in FIG. 1.

FIG. 2 is a side sectional view of the process chamber 100 with a cover substrate 150 in a spaced position, according to one implementation of the disclosure. The transfer mechanism (not shown) may be used to position the cover substrate 150 on the plurality of lift pins 130 extending above the substrate support 120. The cover substrate 150 has a cover substrate bottom 172, a cover substrate top 174, and a cover substrate outer surface 176. The cover substrate bottom 172 is in physical engagement with the lift pins 130 and is supported by the lift pins 130. Each of the lift pins 130 may have a lift pin bottom end that is engagement with the bottom pumping plate 144. The lift pins 130 are configured to move relative to the substrate support 120 as the substrate support 120 is raised and lowered by the lift mechanism 115.

When the cover substrate 150 is on the lift pins 130 with the substrate support 120 in the lowered position 118, the cover substrate 150 is in the spaced position so as to be vertically separated from the top support surface 122 of the substrate support 120. The top edge member 146 extends over and is vertically spaced from the top support surface 122 by a vertical distance. During a cleaning process, the top support surface 122 of the substrate support 120 may receive a cover substrate 150 to protect the underlying top support surface 122 of the substrate support 120. The purge volume 180 includes a top purge volume 288 disposed between the top support surface 122 substrate support 120 and the cover substrate and a bottom purge volume 284 disposed below the substrate support 120. The plurality of lift pins 130 provide for a top purge volume 288 between the cover substrate 150 and the top support surface 122 of the substrate support 120, and a bottom purge volume 284.

In some implementations, the cover substrate 150 may comprise a halogen resistant material. The side surface 149 is laterally spaced from the cover substrate outer surface 176 to define the purge gap 166. When the cover substrate 150 is in the spaced position, in some implementations the cover substrate outer surface 176 opposes the side surface 149 to define the purge gap 166. The top edge member 146 forms a ring around the cover substrate 150 and is planar with the cover substrate to form the top purge barrier 178 separating the top purge volume 288 from the process volume 109 with the purge gap 166 extending through the top purge barrier 178. The lateral distance X, as shown in FIG. 2, between the cover substrate outer surface 176 and the side surface 149 may be in a lateral distance range of 1 mm-3 mm. The vertical distance Y between the bottom surface 148 of the top edge member 146 and the top support surface 122 may be in a vertical distance range of 1 mm to 8 mm.

Figure 3:
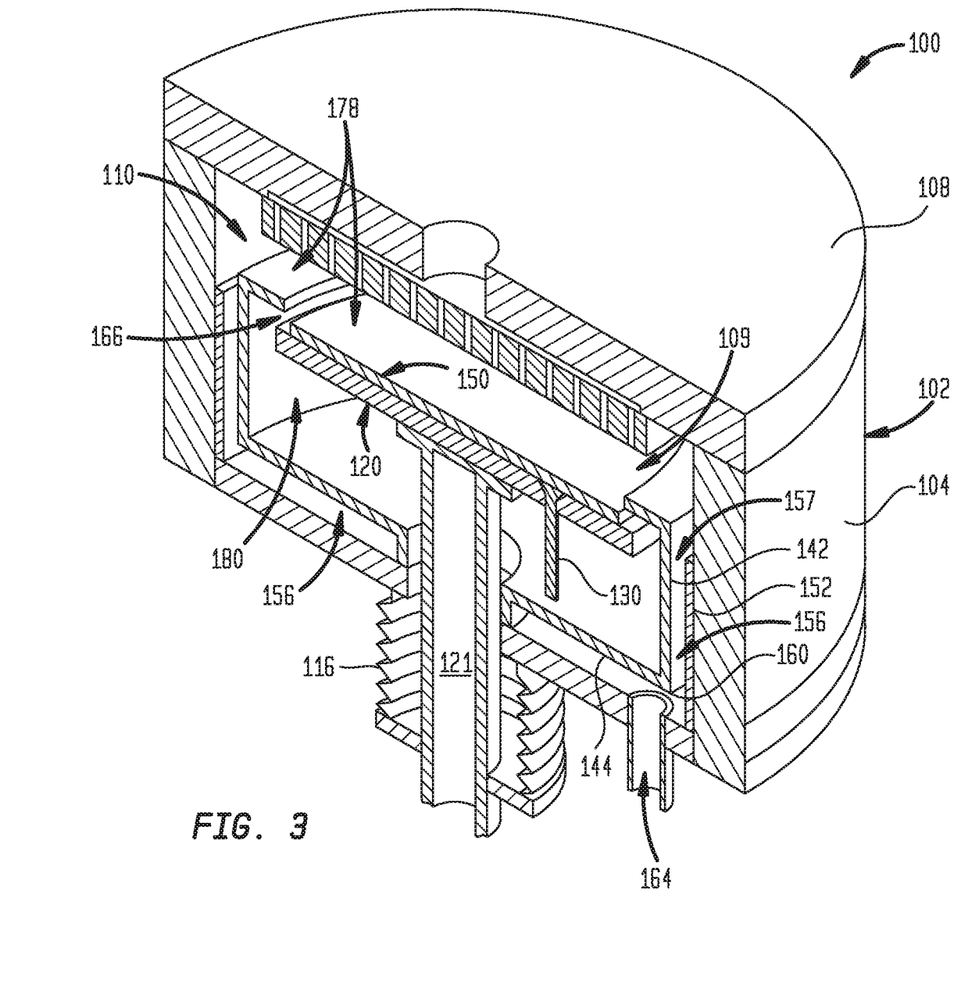
FIG. 3 is a perspective view of the process chamber with the cover substrate in the non-spaced position, according to one implementation of the disclosure.

FIG. 3 is a perspective view of the process chamber 100 of FIG. 2. The side pumping liner 142 of the pumping liner 141 may be disposed adjacent the interior chamber surface 154. The side pumping liner 142 surrounds the purge volume 180. As shown in FIG. 3, the side pumping liner 142 and the top edge member 146 each have an annular shape. The top edge member 146 forms an edge ring that surrounds the cover substrate 150. The side pumping liner 142 is disposed around the substrate support 120 to separate the purge volume 180 from the outer flow path 156. The top edge member 146 forms a ring around the cover substrate 150. The slit valve (not shown) may extend through a portion of the chamber body 102 and the side pumping liner 142.

Figure 4:
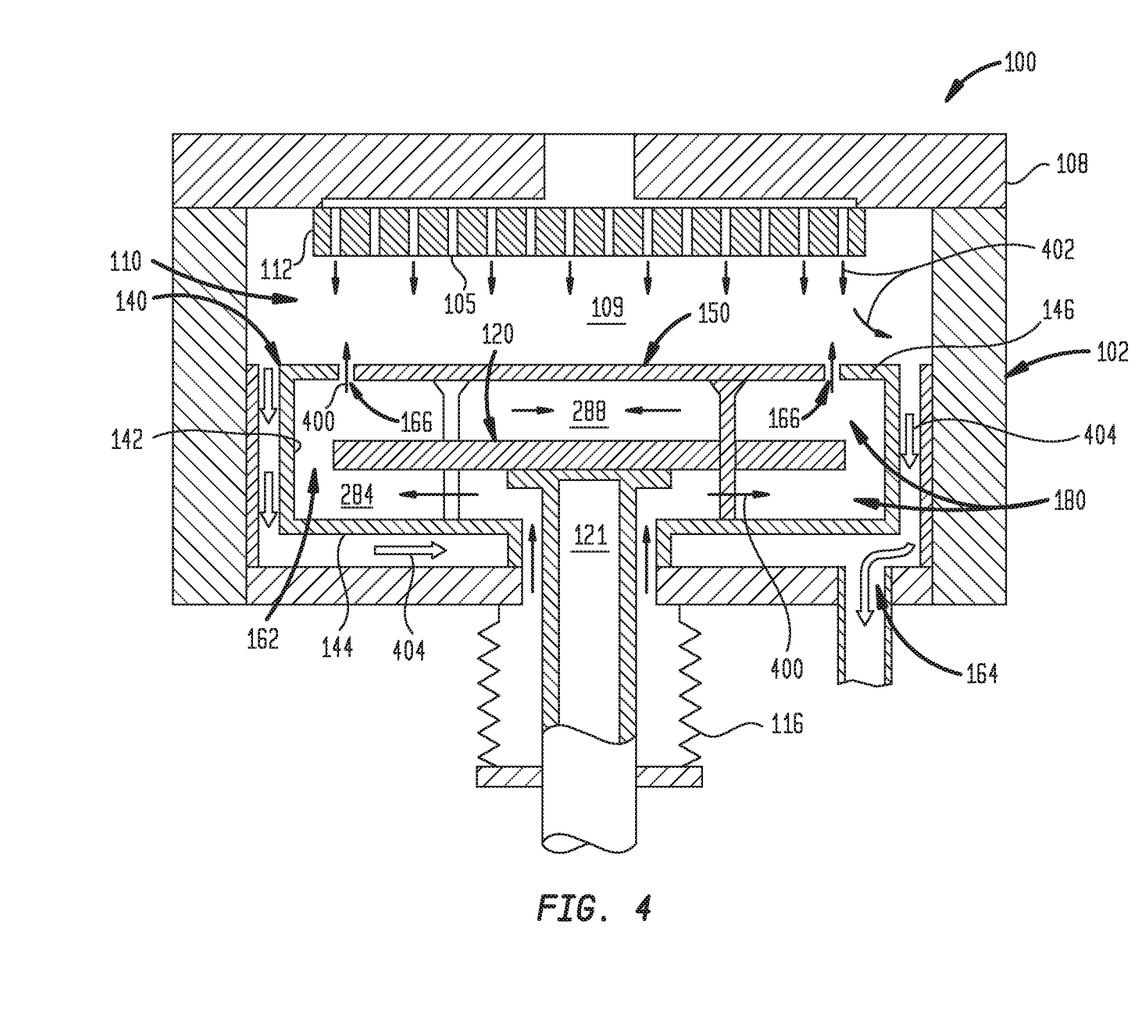
FIG. 4 is a cross-sectional schematic of the process chamber with the cover substrate in the spaced position showing flow of a cleaning fluid and a purge gas during a cleaning process, according to one implementation of the disclosure.

FIG. 4 is a cross-sectional schematic of the process chamber 100 showing flow of a cleaning fluid during a cleaning process, according to one implementation of the disclosure. The operation of process chamber 100 includes a cleaning process for cleaning the process chamber 100 with a cleaning fluid. The cleaning fluid may be a fluorine-containing reactive gas. For example, the cleaning fluid may include nitrogen fluoride ($NF_3$). The cleaning fluid may be supplied to the process volume 109 of the process chamber 100 by the cleaning fluid supply 111, which may be a remote plasma source. The cleaning fluid supply 111 is coupled to the fluid distribution plate 112 for supplying the cleaning gas to the process volume 109. The cleaning gas may include fluorine radicals. The process kit 140 helps control the flow of the cleaning fluid in the interior volume 110 and control what portions of the interior volume 110 that the cleaning fluid flows through.

The process kit 140 is configured to control the flow profile through the process chamber 100 in order to protect the substrate support 120 from the cleaning fluid. A purge gas is used together with the process kit 140 to generate a purge gas curtain that blocks the cleaning fluid from contacting the substrate support 120 during the cleaning process. The purge gas curtain prevents the cleaning fluid from reaching the substrate support 120 and reacting with the substrate support material and forming contaminants in the process chamber 100.

As shown in FIG. 4, the substrate support 120 is in the lowered position 118. The cover substrate 150 is in the spaced position and is supported by the lift pins 130. The purge gas in combination with the process kit 140 protects the substrate support 120 by placing a fluid curtain that blocks the cleaning fluid from coming into contact with the substrate support 120. By way of example only, the purge gas may include inert gases and/or $O_2$, among others. In one implementation, the purge gas may be argon. The purge volume 180 is defined by the side pumping liner 142, the bottom pumping plate 144, the top edge member 146 and the cover substrate 150. In the implementation shown in FIG. 4, the purge volume 180 includes the top purge volume 288 disposed below the cover substrate 150 and top edge member 146 and above the substrate support 120. The purge volume 180 further includes a bottom purge volume 284 disposed below the top purge barrier 178 and above the bottom pumping plate 144.

In the cleaning process, the purge gas flows in the bottom purge volume 284 from the purge gas opening 139 extending through the process chamber 100. In some implementations, during an initial purging process the purge gas is pumped into purge volume 180 prior to the cleaning fluid being pumped into the process volume 109. The initial purging process may be performed in the process chamber 100 before performing the cleaning process. In one implementation, the flowing of the purge gas to the purge volume 180 starts before the flowing of the cleaning fluid through the fluid distribution plate 112 to the process volume 109 during the cleaning process. The purge gas forms a fluid curtain around the substrate support 120. The flow of the purge gas is shown by purge arrows 400 flowing from purge gas opening 139 into the bottom purge volume 284. The purge gas is shown by purge arrows 400 flowing through the substrate support outer opening 162 to the bottom purge volume 284, through the substrate support outer opening 162 and to the top purge volume 288. The top purge volume 288 of purge volume 180 is in fluid communication with the process volume 109, and the purge gas flows from the top purge volume 288 to the process volume 109 through purge gap 166. The purge gas may then flow to the outer flow path 156 and through exhaust outlet 164. The vacuum pump 165 may be used to pump the purge gas through the outer flow path 156 to the exhaust outlet 164. The purge volume 180 is maintained at a positive pressure with respect to the process volume 109 so that purge gas flows from the purge volume 180 to the process volume 109. The positive pressure is maintained in the top purge volume 288 so that purge gas flows through the purge gap 166 to block cleaning fluid from flowing from the process volume 109 through the top purge barrier 178 to the top purge volume 288. In other words, the pressure in the purge volume 180 is greater than the pressure in the process volume 109 during the cleaning process.

While flowing the purge gas through the purge volume 180 and to the process volume 109, the cleaning process starts. The flowing of the cleaning fluid to the process volume 109, in some embodiments, includes starting to flow the cleaning fluid through the fluid distribution plate 112 from the cleaning fluid supply 111 while the process volume 109 contains purge gas from the initial purging process. In the cleaning process, the cleaning fluid flows into the process volume 109 by flowing cleaning fluid through the fluid distribution plate 112, as depicted by cleaning fluid arrows 402. In some implementations, the cleaning fluid is supplied by the cleaning fluid supply 111, which in some embodiments may be a remote plasma source. The cleaning fluid from the process volume 109 and purge gas that flows into the process volume 109 from the purge volume 180 flows to the outer flow path 156 and out the exhaust outlet 164, as depicted by exhaust arrows 404. The pumping liner 141 separates the purge volume 180 disposed below the cover substrate 150 and the top edge member 146 from the outer flow path 156 disposed between the chamber body 102 and the pumping liner 141.

The cleaning fluid flows out of the process chamber 100 through the exhaust outlet 164. The cover substrate 150 and the top edge member 146 form the top purge barrier 178 that blocks the cleaning fluid from the purge volume 180 and the substrate support 120 disposed in the purge volume 180. Purge volume 180 is maintained at a positive pressure with respect to the process volume 109. The positive pressure has the benefit of stopping or reducing the contact of the cleaning fluid with the substrate support 120 during the cleaning process.

In some implementations, after the cleaning process a post cleaning process starts. During the post cleaning phase, the flow of cleaning fluid through the fluid distribution plate 112 stops and the purge gas continues to be supplied to the process chamber 100. The purge gas continues to be supplied to the purge volume 180 of the process chamber 100 for a selected time period after stopping the flow of process gas to the process volume 109 during the cleaning process. The selected time period is an amount of time selected to remove cleaning fluid from the process volume 109 supplied during the cleaning process.

After the cleaning process and the post cleaning process, the cover substrate 150 may be removed from the process volume 109. The process chamber 100 is then ready for a substrate to be transferred into the process chamber 100 by transferring the substrate through the slit valve 638, shown in FIG. 6, and above the substrate support 120. The substrate may be placed on the lift pins 130 or in physical contact with the top support surface 122 by a transfer mechanism (not shown) in a conventional manner. A deposition process may then be performed on the substrate by flowing process gas through the fluid distribution plate 112 to deposit one or more layers on the substrate. The process gas flows through the outer flow path 156 to the exhaust outlet 164. After a number of substrates have been processed in the process chamber 100, a cleaning process as described with respect to FIG. 4 may be performed.

Figure 5:
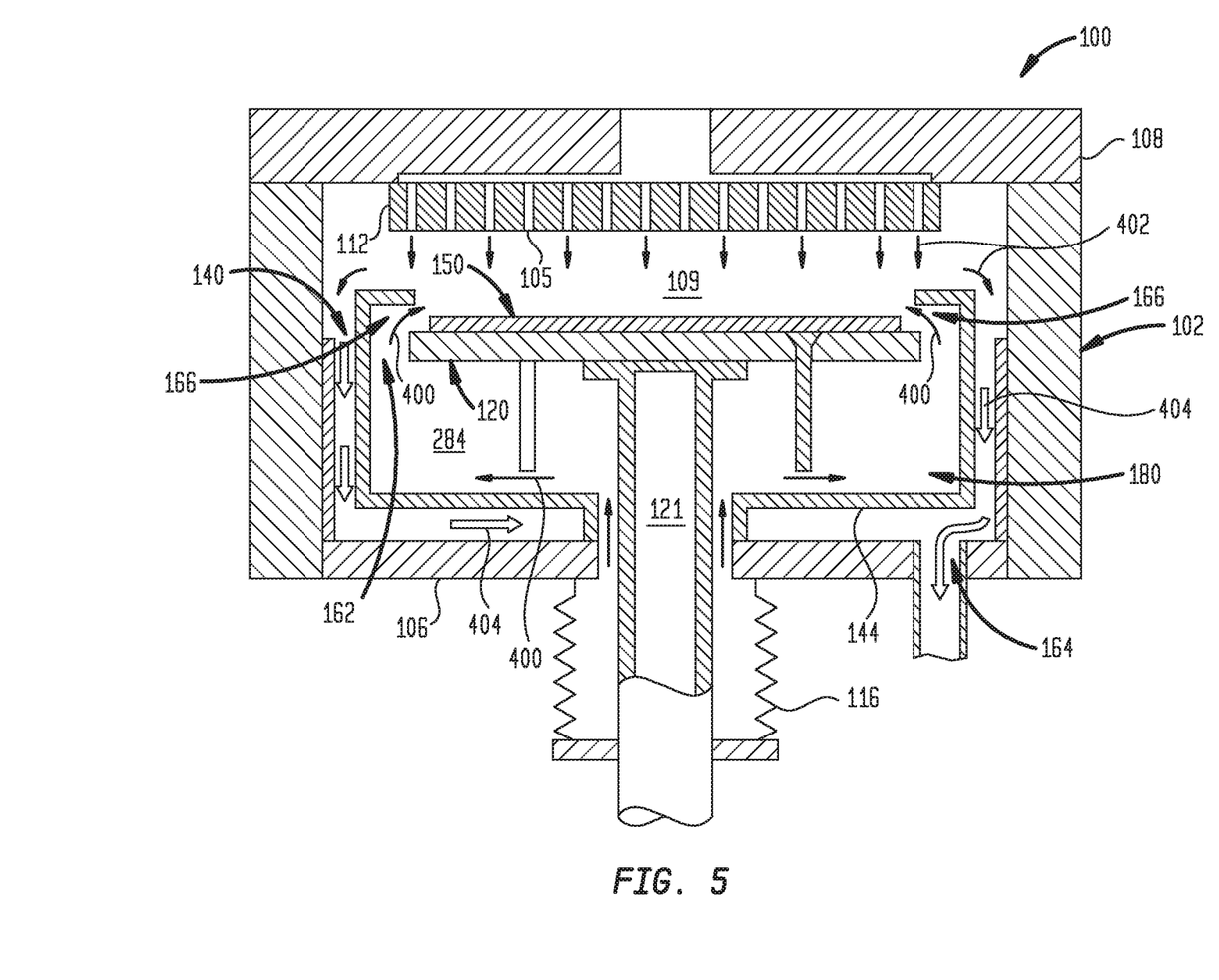
FIG. 5 is a cross-sectional schematic of the process chamber shown in FIG. 4 with the cover substrate in the non-spaced position showing flow of the cleaning fluid during the cleaning process, according to one implementation of the disclosure.

FIG. 5 is a cross-sectional schematic of the process chamber 100 shown in FIG. 4 with the cover substrate 150 in a non-spaced position showing flow of a cleaning fluid during the cleaning process, according to one implementation of the disclosure. The cleaning process for the process chamber 100 operates in a similar manner as described with respect to FIG. 4. The cover substrate 150 is in physical contact with the top support surface 122 of the substrate support 120. In some implementations, the substrate support 120 has been raised to the raised position 117 with the cover substrate 150 in physical contact with the top support surface 122. The cover substrate 150 protects the top support surface 122 of the substrate support 120 by being in physical contact with the substrate support. The purge volume 180 is disposed below the top purge barrier 178 formed by the top edge member 146 and the substrate support 120.

During the cleaning process, the purge gas flows into the purge volume 180 so that the purge gas in the purge volume 180 is at a positive pressure relative to the process gas in the process volume 109. In some implementations, the top edge member 146 is disposed above the top support surface 122 of the substrate support 120. In other implementations, the top edge member 146 opposes the cover substrate 150 in a manner as described with respect to the process chamber 100 shown in FIG. 4. The purge gap 166 is selected to maintain a positive pressure in the purge volume 180 during the cleaning process. The flowing of the purge gas through the purge gap 166 blocks the cleaning fluid in the process volume 109 from flowing to the purge volume 180. The process volume 109 and the purge volume 180 are maintained at a vacuum relative to the ambient pressure external of the process chamber 100.

FIG. 6 is a cross-sectional schematic of a process chamber 600 with the cover substrate 150 in the spaced position showing flow of a cleaning fluid during a cleaning process. The process chamber 600 is similar to the process chamber 100 with differences described herein. The process chamber 600 includes a process kit 640. The process kit 640 includes a pumping liner 641 and a top edge member 646. The pumping liner 641 includes a side pumping liner 642, a first bottom pumping plate 644, and a second bottom pumping plate 645. The side pumping liner 642 surrounds the substrate support 120. The side pumping liner 642 includes a liner top end 658 that is disposed above the substrate support 120. The pumping liner 641 may function as a radiation shield so as to shield the chamber side wall 104 from heat radiated from the substrate support 120. A slit valve 638 may extend through the chamber side wall 104 of chamber body 102 to provide an opening to transfer a substrate or cover substrate 150 into or out of the process volume 109. The slit valve 638 is closed during the cleaning process.

The side pumping liner 642, the first bottom pumping plate 644, top edge member 646, and the cover substrate 150 define the purge volume 680. The purge volume 680 includes a top purge volume 688 and a bottom purge volume 684. The top purge volume 688 is disposed below the cover substrate 150 and top edge member 646 and above the substrate support 120. The bottom purge volume 684 is disposed below the substrate support 120, above the first bottom pumping plate 644, and within the side pumping liner 642.

The second bottom pumping plate 645 extends from the chamber side wall 104 and is spaced below the first bottom pumping plate 644. An outer flow path 656 is disposed between the side pumping liner 642 and the chamber side wall 104, and between the first bottom pumping plate 644 and the second bottom pumping plate 645.

The top edge member 646 surrounds the cover substrate 150. The top edge member 646 is coupled to the chamber side wall 104, and extends from the chamber side wall 104 to extend over the substrate support 120. The top edge member 646 has a top opening 657 that extends through the top edge member 646. The top opening 657 is disposed above the outer flow path 656. The top edge member 646 has a side surface 649. The top edge member 646 extends over the substrate support 120. The side surface 649 is laterally spaced from the cover substrate 150 to form the purge gap 166. In some implementations, when the cover substrate 150 is in the spaced position, as shown in FIG. 6, the cover substrate outer surface 176 opposes the side surface 149 to define the purge gap 166. An outer path opening 655 opens from the top purge volume 688 of purge volume 680 to the outer flow path 656. The outer path opening 655 is defined by the liner top end 658 and the top edge member 646.

A purge gas isolates the substrate support 120 during the cleaning process. During the cleaning process, the purge gas flows into the bottom purge volume 684, as shown by purge arrows 400. The purge volume 680 is at a positive pressure relative to the process volume 109. The positive pressure in the purge volume 680 is maintained when cleaning fluid flows into the process volume from the fluid distribution plate 112. As shown by the purge arrows 400, the purge gas flows into the outer flow path 656 through the outer path opening 655. In addition, the purge gas flows to the process volume 109 through the purge gap 166. Cleaning fluid flowing from the fluid distribution plate 112 is depicted by cleaning fluid arrows 402, and cleaning fluid is shown flowing to the process volume 109, through the top opening 657, through outer flow path 656, and through exhaust outlet 164.

Figure 7:
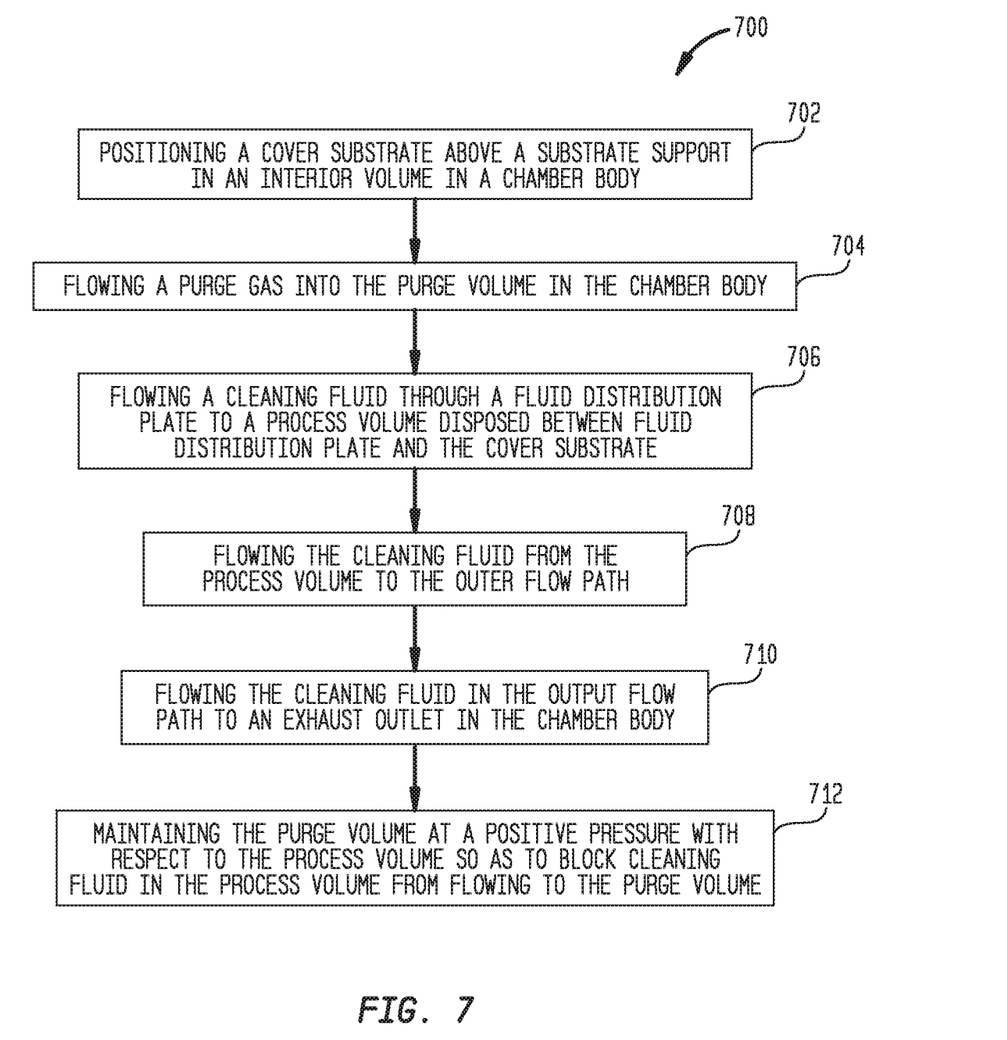
FIG. 7 is a flow chart showing a method of cleaning the process chamber, according to one implementation of the disclosure.

FIG. 7 is a flow chart showing a method of cleaning the process chamber 100, 600. The cleaning method 700 includes positioning the cover substrate 150 at block 702 above a substrate support 120 in an interior volume 110 in a chamber body 102. The cleaning method 700 includes performing a cleaning process that provides for flowing a purge gas into the purge volume 180 at block 704. The bottom support surface 124 and the side support surface 126 of the substrate support 120 are disposed in the purge volume 180.

At block 706, the cleaning process includes flowing the cleaning fluid through the fluid distribution plate 112 to the process volume 109 disposed between fluid distribution plate 112 and the cover substrate 150. The flowing of the purge gas to the purge volume 180 and the flowing of the cleaning fluid from the cleaning fluid supply 111 to the process volume 109 occurs simultaneously during at least a portion of the cleaning process. In some embodiments, the flowing of the purge gas to the purge volume 180 starts before the flowing of the cleaning fluid through the fluid distribution plate 112 to the process volume 109 during the cleaning process. The flowing of the purge gas to the purge volume 180 and the flowing of the cleaning fluid from the cleaning fluid supply 111 to the process volume 109 occurs simultaneously during the cleaning process.

The cleaning fluid in the process volume 109 flows, at block 708, to the outer flow path 156, and at block 710 the cleaning fluid flows in the outer flow path 156 to the exhaust outlet 164 in the chamber body 102. At block 712, the cleaning fluid in the process volume 109 is blocked from flowing to the purge volume 180 by maintaining the purge volume 180 at a positive pressure with respect to the process volume 109.

Benefits of the disclosure include the shielding of the substrate support 120 from the cleaning fluid to prevent or reduce the formation of contaminants due to cleaning fluid reaction with aluminum nitride or other materials of the substrate support 120 during the cleaning process. The shielding of the substrate support 120 helps prevent the substantial contaminants that may form in the process chamber 100, 600 when the substrate support 120 is at a high temperature. The substrate support 120 may be at a high temperature due to use of the process chamber to manufacture substrates at processing temperatures equal to or greater than 650 degrees Celsius.

To summarize, the implementations disclosed herein relate to a cover substrate 150 on lift pins 130 that protect a substrate support 120 in a process chamber 100, 600 during cleaning. The process chamber 100, 600 utilizes an inert bottom purge flow to shield the substrate support 120 from cleaning fluids such that the substrate support 120 may be heated to temperatures greater than about 650 degrees Celsius. Additionally, the top purge barrier 178 direct and control the flow profile of the cleaning fluid away from the substrate support 120, such that free radical damage does not occur on the substrate support 120.

While the foregoing is directed to implementations of the present disclosure, other and further implementations of the disclosure may be devised without departing from the basic scope thereof, and the scope thereof is determined by the claims that follow.

What is claimed is:

1. A method of cleaning a process chamber, comprising:
   positioning a cover substrate above a substrate support in an interior volume in a chamber body of the process chamber, wherein a process kit comprising a top edge member and a pumping liner are disposed in the interior volume, the pumping liner disposed radially outward of the cover substrate, and wherein the pumping liner separates a purge volume disposed below the cover substrate and the top edge member from an outer flow path disposed between the chamber body and the pumping liner;
   performing a cleaning process, comprising:
      flowing a purge gas in the purge volume, wherein a bottom support surface and a side support surface of the substrate support are disposed in the purge volume;
      flowing a cleaning fluid through a fluid distribution plate to a process volume disposed between the fluid distribution plate and the cover substrate;
      flowing the cleaning fluid in the process volume to the outer flow path;
      flowing the cleaning fluid in the outer flow path to an exhaust outlet in the chamber body; and
      maintaining the purge volume at a positive pressure with respect to the process volume so as to block the cleaning fluid in the process volume from flowing into the purge volume.

2. The method of claim 1, comprising:
   performing an initial purging process in the process chamber before performing the cleaning process, comprising:
      flowing the purge gas to the purge volume from a purge gas supply;
      flowing the purge gas from the purge volume to the process volume; and
      flowing the purge gas from the process volume to the outer flow path and to the exhaust outlet.

3. The method of claim 2, wherein the flowing of the cleaning fluid to the process volume comprises starting to flow the cleaning fluid through the fluid distribution plate from a cleaning fluid supply during the cleaning process while the process volume contains purge gas from the initial purging process.

4. The method of claim 3, wherein the flowing of the purge gas to the purge volume starts before the flowing of the cleaning fluid through the fluid distribution plate to the process volume during the cleaning process, and wherein the flowing of the purge gas to the purge volume and the flowing of the cleaning fluid from the cleaning fluid supply to the process volume occurs simultaneously during the cleaning process.

5. The method of claim 2, comprising:
   performing a post cleaning process comprising:
      stopping the cleaning fluid to the process volume after the cleaning process;
      after stopping the cleaning fluid, flowing the purge gas from the purge gas supply to the purge volume and to the outer flow path, and maintaining the positive pressure of the purge volume to block the cleaning fluid from the purge volume during the post cleaning process.

6. The method of claim 1, wherein the substrate support has a top support surface, wherein the top edge member extends over and is vertically spaced from the top support surface by a vertical distance.

7. The method of claim 1, wherein the top edge member has a side surface, wherein the cover substrate has a cover substrate outer surface, and wherein the side surface is laterally spaced from the cover substrate outer surface by a lateral distance to define a purge gap, and wherein the purge gas flows from the purge volume to the process volume through the purge gap.

8. The method of claim 7, wherein the lateral distance is in a lateral distance range of 1 mm to 3 mm.

9. The method of claim 6, wherein the vertical distance is in a vertical distance range of 1 mm to 8 mm.

10. The method of claim 7, wherein the cover substrate is supported on a plurality of lift pins in a spaced position, wherein the plurality of lift pins extend through the substrate support disposed in the process chamber, and wherein the purge volume comprises a top purge volume disposed between the substrate support and the cover substrate and a bottom purge volume disposed below the substrate support.

11. The method of claim 1, wherein the cover substrate is disposed on the top support surface in a non-spaced position where the cover substrate is in physical contact with the top support surface.

12. The method of claim 10, wherein the pumping liner comprises a side pumping liner disposed around the substrate support to separate the purge volume from the outer flow path, wherein the top edge member forms a ring around the cover substrate and is planar with the cover substrate to form a top purge barrier separating the top purge volume from the process volume with the purge gap extending through the top purge barrier.

13. The method of claim 1, wherein the fluid distribution plate is in fluid communication with a cleaning fluid supply, and wherein the cleaning fluid supply is a remote plasma source supplying a fluorine-containing reactive gas to the process volume.

* * * * *